United States Patent
Chen et al.

(10) Patent No.: US 6,519,150 B1
(45) Date of Patent: Feb. 11, 2003

(54) LINKAGE-TYPE FIXING DEVICE FOR HEAT-RADIATOR OF CENTRAL PROCESSOR

(76) Inventors: Hsin-Yi Chen, No. 10, Wen-Chee-Wu Street, Gueishan Hsiang, Taoyuan Hsien (TW); Hui-Chia Huang, No. 8, Lane 202, Long-An Road, Hsichi City, Taipei Hsien (TW)

( * ) Notice: Subject to any disclaimer, the term of this patent is extended or adjusted under 35 U.S.C. 154(b) by 0 days.

(21) Appl. No.: 09/471,329

(22) Filed: Dec. 23, 1999

(51) Int. Cl.⁷ .................................................. H05K 7/20
(52) U.S. Cl. .................. 361/697; 24/458; 248/510; 257/719; 361/704; 361/710
(58) Field of Search .................. 24/457–458; 174/16.3; 165/80.2, 80.3, 121–122, 126–127; 257/718–719, 726–727; 248/505, 510; 361/694–695, 697, 704, 707, 709–710

(56) References Cited

U.S. PATENT DOCUMENTS

| | | | |
|---|---|---|---|
| 6,021,045 A | * | 1/2000 | Johnson ....................... 361/704 |
| 6,336,499 B1 | * | 1/2002 | Liu ............................. 361/697 |
| 6,343,013 B1 | * | 1/2002 | Chen ........................... 361/695 |
| 6,386,274 B1 | * | 5/2002 | Wang et al. ................ 165/80.3 |

* cited by examiner

*Primary Examiner*—Gregory Thompson
(74) *Attorney, Agent, or Firm*—Rosenberg, Klein & Lee

(57) ABSTRACT

Linkage-type fixing device for heat-radiator of central processor including: at least two locating pins downward projecting from the bottom end of the heat-radiator; a first latch device having a latch board downward projecting from a first side thereof for hooking a projecting hook of the insertion seat of the central processor, the panel body of the first latch device being formed with at least two concentrically arranged latch slots for correspondingly latching with the locating pins of the heat-radiator; and a second latch device slidably disposed at a second lateral end of the first latch device. A hook board downward projects from a second side of the second latch device. The panel body of the second latch device is formed with a linkage slot. The distance between a first end of the linkage slot and the circular center of the latch slots is smaller than the distance between a second end of the linkage slot and the circular center of the latch slots. When one of the locating pins of the heat-radiator is operatively slid within the linkage slot, the second latch device is outward pushed or inward tightly pulled by way of linkage so as to unlatch from or tightly latch with the insertion seat of the central processor.

10 Claims, 5 Drawing Sheets

LINKAGE-TYPE FIXING DEVICE FOR HEAT-RADIATOR OF CENTRAL PROCESSOR

BACKGROUND OF THE INVENTION

The present invention relates to a linkage-type fixing device for heat-radiator of central processor which by means of turning the heat-radiator, a second latch device is moved outward or inward by way of linkage so as to unlatch from or tightly latch with the insertion seat of the central processor.

It is known the chips, such as a central processor, used in a computer will generate a great amount of heat after a period of operation. The heat must be radiated in time. Otherwise, the central processor is subject to damage. Therefore, generally a suitable heat-radiator or heat-dissipating fan is mounted on the central processor for enhancing heat-radiating efficiency. The heat-radiator is latched on the central processor by a fixing latch device which is made of a metal board by way of punching. The metal board is locked at the bottom end of the heat-radiator and a latch board downward extends from each end of the metal board. The two latch boards are resiliently tightly latched with two ends of an insertion seat of the central processor so as to firmly install the heat-radiator on the central processor. However, such conventional fixing latch device has some shortcomings as follows:

1. The fixing latch device must be locked on the heat-radiator by a screwdriver so that it is troublesome to complete assembly.
2. The distance between the latch boards of two sides of the fixing latch device is fixed and cannot be adjusted. The distance is approximately equal to the width of two sides of the insertion seat of the central processor. Therefore, once the fixing latch device is latched with the insertion seat, in order to unlatch the fixing latch device from the insertion seat and detach the heat-radiator from the central processor, the latch board on one side must be pried upward and outward by a screwdriver. Such procedure is inconvenient and laborious.

SUMMARY OF THE INVENTION

It is therefore a primary object of the present invention to provide a linkage-type fixing device for heat-radiator of central processor including: at least two locating pins downward projecting from the bottom end of the heat-radiator; a first latch device having a latch board downward projecting from a first side thereof for hooking a projecting hook of the insertion seat of the central processor, the panel body of the first latch device being formed with at least two concentrically arranged latch slots for correspondingly latching with the locating pins of the heat-radiator; and a second latch device slidably disposed at a second lateral end of the first latch device. A hook board downward projects from a second side of the second latch device. The panel body of the second latch device is formed with a linkage slot. The distance between a first end of the linkage slot and the circular center of the latch slots is smaller than the distance between a second end of the linkage slot and the circular center of the latch slots. When one of the locating pins of the heat-radiator is operatively slided within the linkage slot, the second latch device is outward pushed or inward tightly pulled by way of linkage so as to unlatch from or tightly latch with the insertion seat of the central processor.

The present invention can be best understood through the following description and accompanying drawings wherein:

DETAILED DESCRIPTION OF THE PREFERRED EMBODIMENTS

Figure 1:
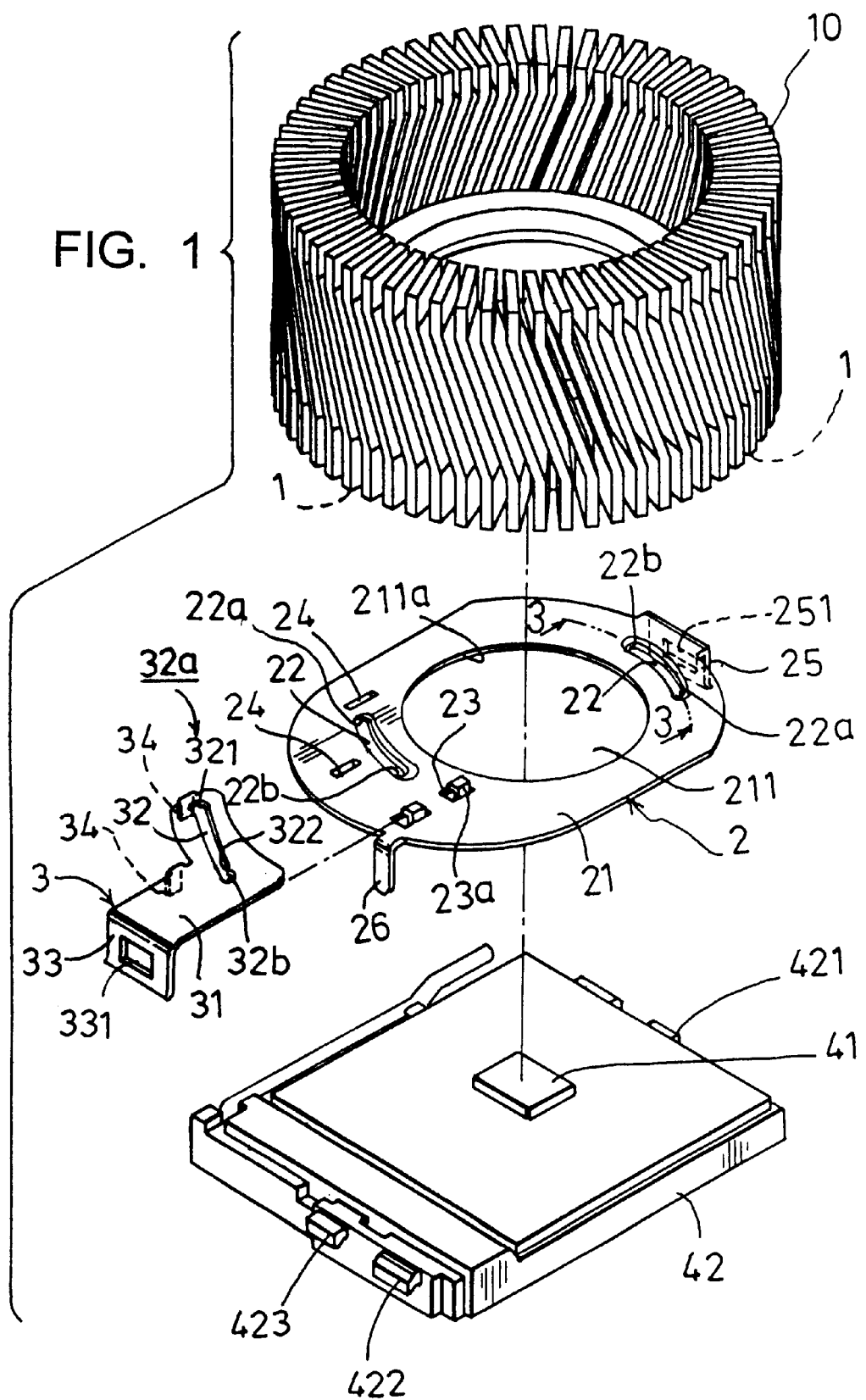
FIG. 1 is a perspective exploded view of the present invention.
Figure 2:
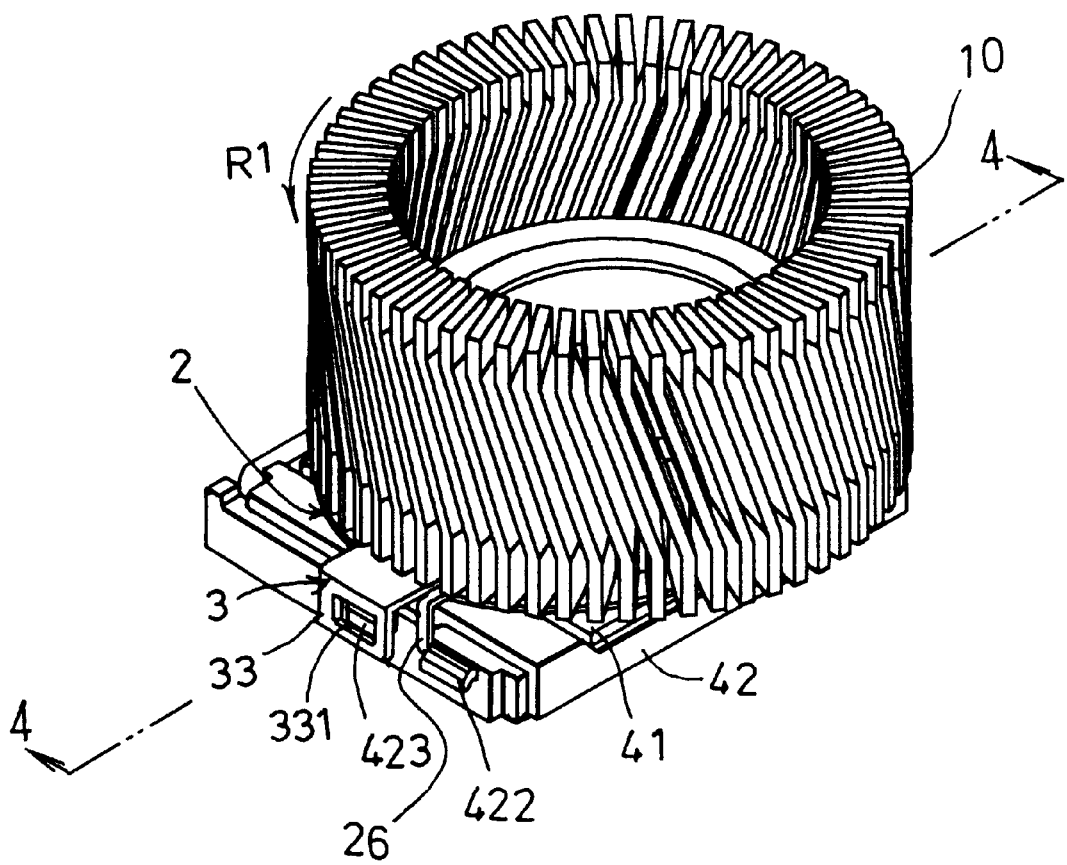
FIG. 2 is a perspective view showing that the heat-radiator is not yet tightly latched with the insertion seat of the central processor.

Please refer to FIGS. 1 to 8. The linkage-type fixing device for heat-radiator of central processor of the present invention includes: at least two locating pins 1 downward projecting from the bottom end of the heat-radiator 10; a first latch device 2 bridged over the insertion seat 42 of a central processor 41 and correspondingly hooked a first lateral latch hook 421 of the insertion seat, the panel body 21 of the first latch device 2 being formed with at least two concentrically arranged latch slots 22 for correspondingly latching with the locating pins 1 of the heat-radiator 10; and a second latch device 3 slidably disposed at a second lateral end of the first latch device 2. The panel body 31 of the second latch device 3 is formed with a linkage slot 32, whereby when one locating pin 1 of the heat-radiator 10 is operatively slided within the linkage slot 32 between a first and a second ends 32a, 32b thereof, the second latch device 3 is outward pushed or inward tightly pulled by way of linkage so as to unlatch from or tightly latch with the insertion seat 42 of the central processor 41.

The heat-radiator 10 of the present invention can be a cylindrical heat-radiator as shown in FIG. 1. Alternatively, the heat-radiator can be a rectangular one. In addition, a heat-radiating fan F can be mounted above the heat-radiator 10 for enhancing the heat-radiating efficiency.

Figure 4:
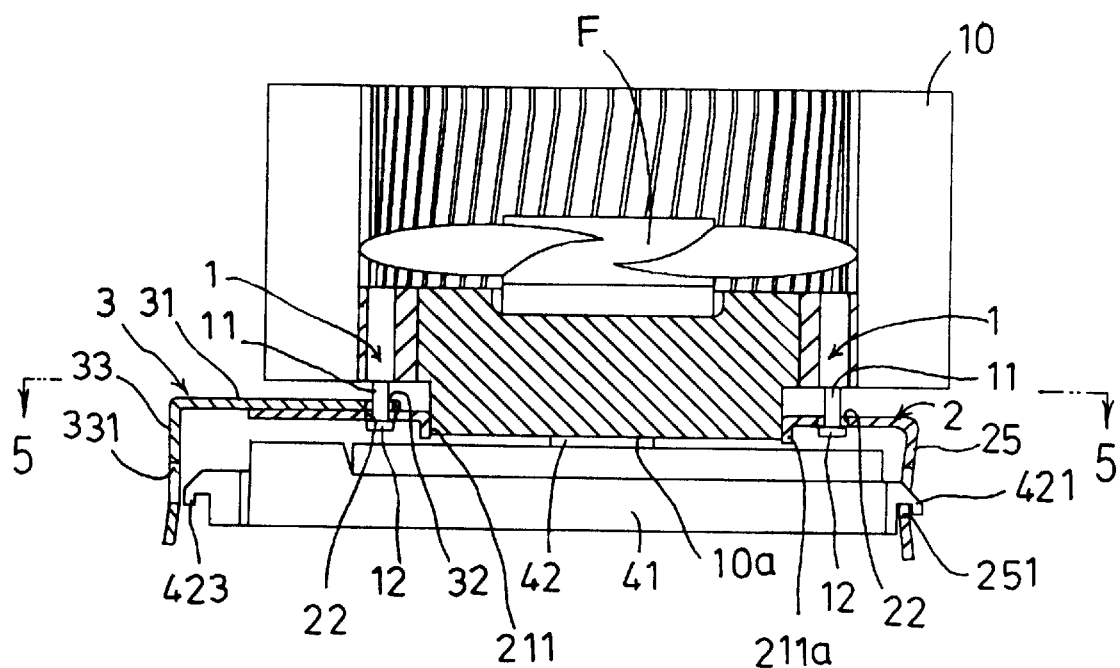
FIG. 4 is a sectional view taken along line 4—4 of FIG. 2.

As shown in FIG. 4, the locating pin 1 includes a pin body 11 and an enlarged head section 12 connected with the bottom end of the pin body 11. The respective locating pins 1 are concentrically arranged and inserted in the bottom end of the heat-radiator 10.

Figure 3:
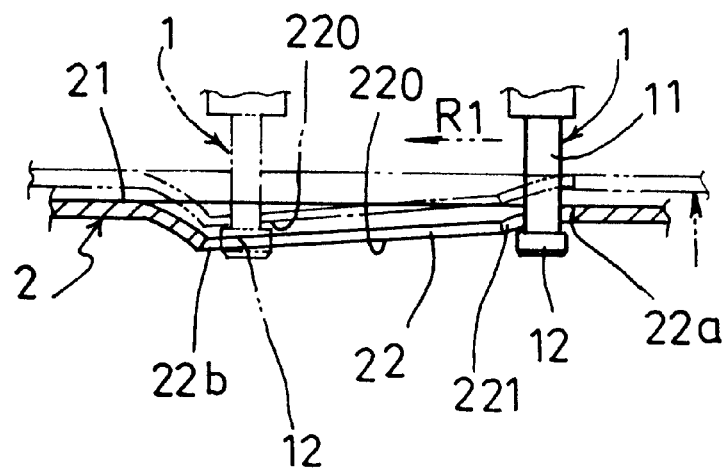
FIG. 3 shows the structure of the latch slot of FIG. 2.

The first latch device 2, as shown in FIGS. 1, 3 and 4, is integrally made of one single metal board by punching, including: a panel body 21 formed with a through hole 211, the periphery of the through hole 211 being formed with a downward projecting flange sect ion 211a for snugly fitting with a projecting shaft section 10a of the bottom end of the heat-radiator 10, the projecting shaft section 10a downward extending to overlie and attach-to the central processor 41; at least two latch slots 22 concentrically formed on the panel body 21, a first end 22a of each latch slot 22 being formed with an enlarged hole 221, whereby the enlarged head section 12 of the locating pin 1 can be correspondingly extended into the enlarged hole 221 to latch with the bottom edge of the latch slot 22, permitting the pin body 11 of the locating pin 1 to slide within the latch slot 22; at least one slide channel 23 formed at the second end of the panel body 21, permitting the second latch device 3 to slide therewithin; at least one stopper slide cavity 24 formed at the second end of the panel body 21, permitting a stopper slide pin 34 of the second latch device 3 to slide therewithin and restricting the sliding distance of the second latch device 3; a latch board 25 downward projecting from the first lateral end of the panel body 21, the latch board 25 being formed with a latch hole 251 for hooking a latch hook 421 of a first lateral end of the insertion seat 42; and a restricting bar 26 downward projecting from the second lateral end edge of the panel body 21, whereby when the panel body 21 of the first latch device 2 is bridged over the central processor 41, the restricting bar 26 is leant against an outer edge of a stopper section 422 of the second lateral end of the insertion seat 42 for stopping the first latch device 2 from being further turned in a rotational direction R1 in the first latch device is latched with the heat-radiator 10. (The stopper section is a conventional structure of a general insertion seat and need not be additionally manufactured.)

The slide channel 23 of the second lateral end of the panel body 21 of the first latch device 2 is formed in such a manner that the second lateral end of the panel body 21 is punched with at least one L-shaped projecting plate 23a which together with the panel body 21 defines therebetween the slide slot 23. In a modification of the present invention, the two opposite sides of the second end of the panel body 21 of the first latch device 2 are respectively disposed with at least two L-shaped projecting plates 23a defining therebetween a slide channel for the second latch device 3 to slide therewithin.

As shown in FIGS. 3, 4, 5, 7 and 8, the first end 22a of each latch slot 22 of the first latch device 2 is formed with an enlarged hole 221. In addition, two lateral edges 220 of the latch slot 22 are gradually downward inclined toward the second end 22b of the latch slot. Accordingly, when the pin body 11 of the locating pin 1 extends into the latch slot 22 with the enlarged head section 12 hooking the bottom edge of the latch slot 22, in case the heat-radiator 10 is turned to make the locating pin 1 slide toward the second end 22b of the latch slot 22, by way of linkage, the first and second latch devices 2, 3 are relatively upward lifted to tightly hook two sides of the insertion seat 42 of the central processor. At the same time, the projecting shaft section 10a of the bottom end of the heat-radiator 10 is relatively tightly attached to and overlaid on the central processor 41, whereby the heat of the central processor 41 can be quickly conducted to the heat-radiator 10.

The second latch device 3 is integrally made of one single metal board by punching, including a panel body 31 stably slidably positioned in the slide channel 23 of the second lateral end of the first latch device 2; a linkage slot 32 which is arch and formed on the panel body 31, whereby when the second latch device 3 is slidably positioned on the second lateral end of the first latch device 2, the distance H1 between a first end 32a of the linkage slot 32 and the circular center 20 of the latch slots is smaller than the distance H2 between a second end 32b of the linkage slot 32 and the circular center 20 of the latch slots, the first end 32a of the linkage slot 32 being formed with an enlarged hole 321, permitting the enlarged head section 12 of the locating pin 1 to pass therethrough and extend into the bottom end of the corresponding latch slot 22; a hook board 33 downward projecting from the second lateral end of the panel body 31 and formed with a latch hole 331 for hooking the latch hook 423 of the second side of the insertion seat 42; and at least one stopper slide pin 34 downward projecting from the edge of the panel body 31 for correspondingly sliding within the stopper slide cavity 24 of the first latch device 2.

The linkage slot 32 of the second latch device 3 is disposed with a projecting section 322 on the edge of the linkage slot near the second end thereof. When the pin body 11 of the locating pin 1 is slidably positioned at the second end 32b of the linkage slot 32, the projecting section 322 stops the outer edge of the pin body 11 to prevent the locating pin 1 from sliding toward the first end 32a of the linkage slot 32 due to shock and making the heat-radiator 10 loosened.

Figure 5:
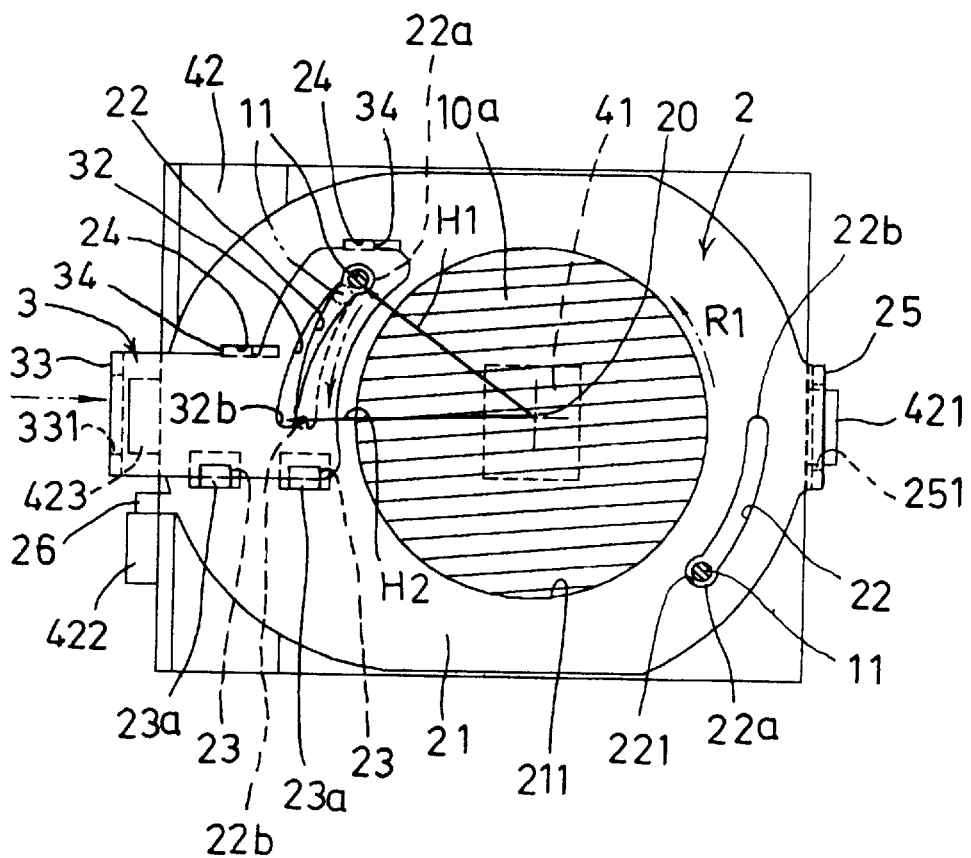
FIG. 5 is a sectional view taken along line 5—5 of FIG. 4.
Figure 6:
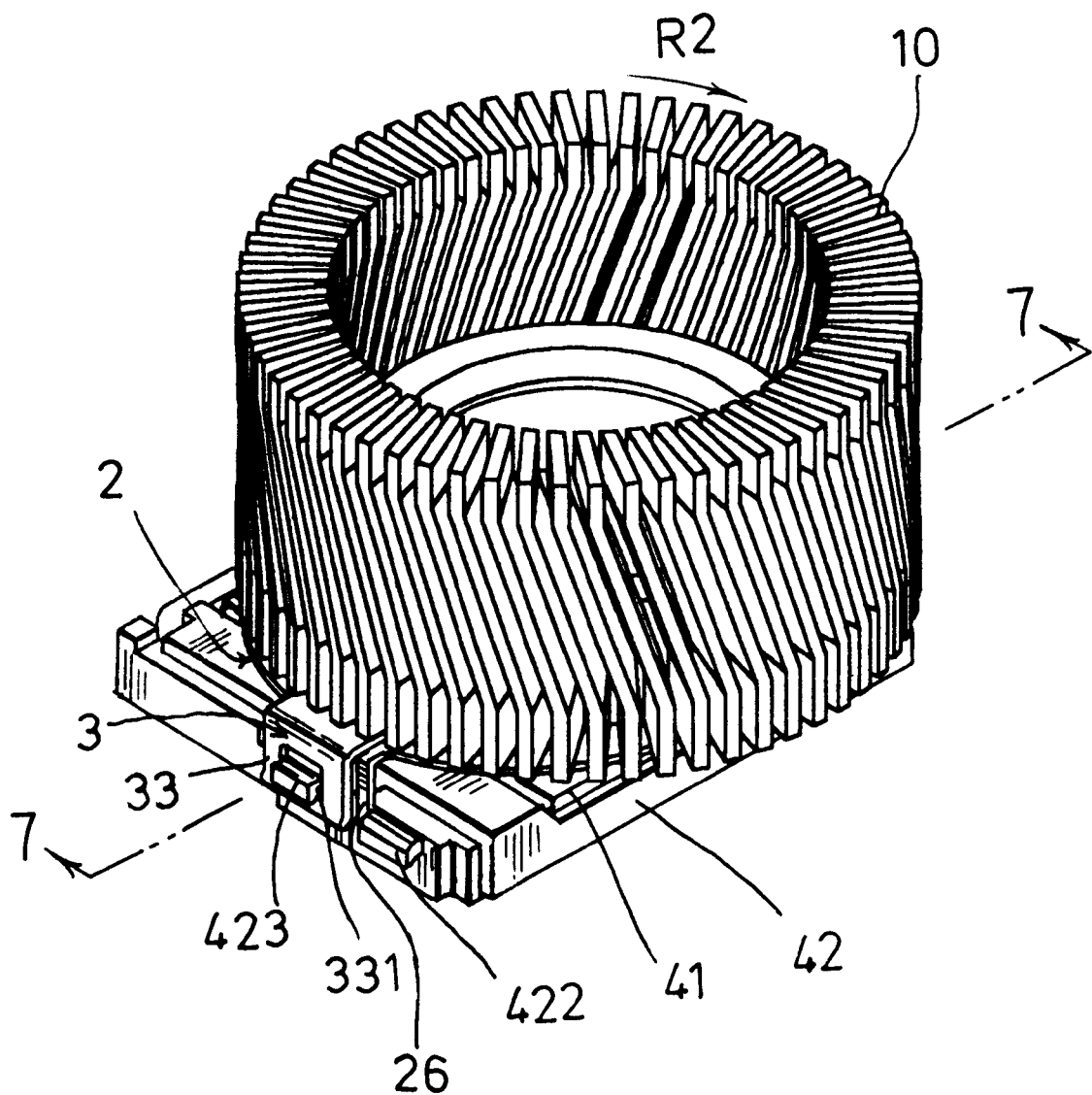
FIG. 6 is a view according to FIG. 2, in which the heat-radiator is turned and tightly latched with the insertion seat.
Figure 7:
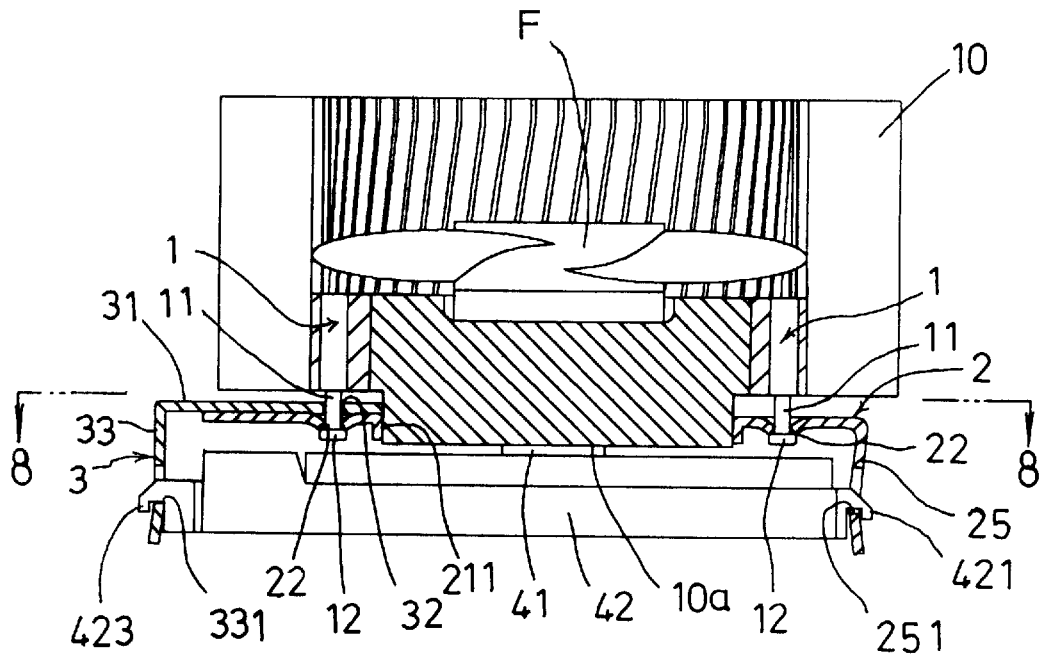
FIG. 7 is a sectional view taken along line 7—7 of FIG. 6.
Figure 8:
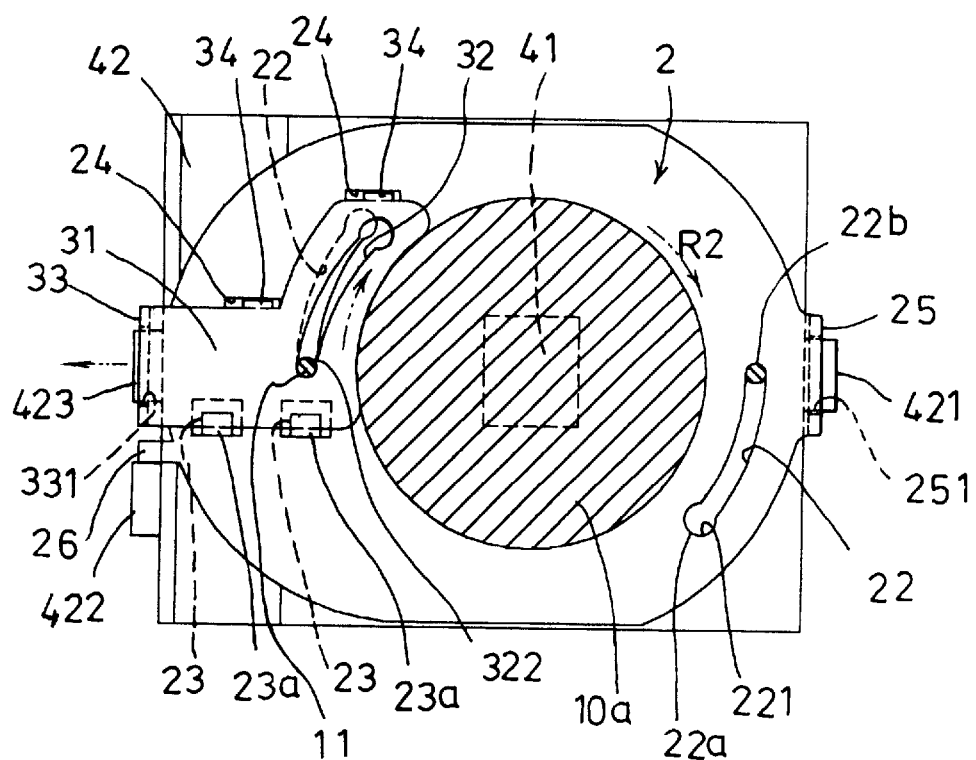
FIG. 8 is a sectional view taken along line 8—8 of FIG. 7.

As shown in FIGS. 1 to 5, when assembled, the second latch device 3 is aligned with and slidably positioned on the second lateral end of the first latch device 2 and the first latch device 2 is bridged over the central processor 41. The latch board 25 of the first latch device 2 is hooked with the latch hook 421 of the first side of the insertion seat 42 of the central processor. Correspondingly, the locating pins 1 of the bottom end of the heat-radiator 10 are passed through the first ends 22a of the latch slots 22 of the first latch device 2. One of the locating pins 1 is sequentially passed through the first end 32a of the linkage slot 32 of the second latch device 3 and the first end 22a of a corresponding latch slot 22. At this time, as shown in FIGS. 4 and 5, the locating pin 1 outward pushes the second latch device 3 to make the hook board 33 thereof positioned on outer side of the latch hook 423 of the second side of the insertion seat 42. When an operator turns the heat-radiator 10 in direction R1, by way of linkage, the locating pins 1 are moved to the second ends 22b of the latch slots 22 of the first latch device 2 so as to relatively upward lift the first and second latch devices 2, 3. Under such circumstance, the projecting shaft section 10a of the bottom end of the heat-radiator 10 tightly attaches to the central processor 41. At the same time, during the movement of the locating pin 1 to the second end 32b of the linkage slot 32 of the second latch device 3, the second latch device 3 is pulled toward the insertion seat 42 as shown in FIGS. 6, 7 and 8. At this time, the hook board 33 of the second latch device 3 is correspondingly tightly latched with the latch hook 423 of the second side of the insert ion seat 42 so as to firmly latch and connect the heat-radiator 10 with the central processor 41.

When it is desired to detach the heat-radiator 10, the operator can turn the heat-radiator 10 in direction R2 of FIG. 6 to make the locating pins 1 move back to the first ends 22a of the latch slots 22 of the first latch device 2. During the movement of one of the locating pins 1 back to the first end 32a of the linkage slot 32 of the second latch device 3, as shown in FIGS. 4 and 5, the locating pin 1 relatively outward pushes the second latch device 3, making the hook board 33 thereof no more hook the latch hook 423 of the second side of the insertion seat 42 of the central processor. At this time, the heat-radiator 10 can be detached from the central processor for easy replacement of the central processor 41.

The linkage-type fixing device for heat-radiator of central processor of the present invention is characterized in that by means of turning the heat-radiator, the second latch device is moved outward or inward by way of linkage so as to unlatch from or tightly latch with the insertion seat of the central processor. Therefore, the assembly and disassembly can be quickly and easily performed without using any tool such as a screwdriver.

The above embodiments are only used to illustrate the present invention, not intended to limit the scope thereof.

Many modifications of the above embodiments can be made without departing from the spirit of the present invention.

What is claimed is:

1. A linkage-type fixing device of a heat-radiator for a central processor, comprising:

at least two locating pins extending from the heat-radiator, each of the locating pins including a pin body and an enlarged head section connected to a bottom end of the pin body, the locating pins being respectively arranged on opposing sides of the heat-radiator and inserted in a bottom end thereof;

a first latch device having a panel body with a latch board projecting downwardly from a first end of the panel body for hooking a latch hook of a first lateral end of an insertion seat of a central processor, the first latch device having at least two latch slots formed in the panel body of the first latch device in spaced relationship for correspondingly latching the locating pins of the heat-radiator;

a second latch device slidably disposed at a second end of the panel body of the first latch device, the second latch device having a panel body with a hook board projecting downwardly therefrom, the hook board being formed with a latch hole, the panel body of the second latch device having a linkage slot formed therein, whereby when the second latch device is slidably positioned on the panel body of the first latch device, a distance between a first end of the linkage slot and a center of the latch slots is smaller than a distance between a second end of the linkage slot and the center of the latch slots, when one of the locating pins of the heat-radiator is operatively slid within the linkage slot, to thereby outwardly push or inwardly tightly pull the second latch device to respectively unlatch the hook board of the second latch device from the insertion seat of the central processor or tightly latch the hook board of the second latch device with the insertion seat.

2. The linkage-type fixing device as claimed in claim 1, wherein the panel body of the first latch device is formed with a through hole for a projecting shaft section of the bottom end of the heat-radiator to extend therethrough and overlie and attach to the central processor; a first end of each latch slot being formed with an enlarged hole for passage therethrough of the enlarged head section of a corresponding locating pin to latch with a bottom edge of the latch slot and permitting the pin body of the corresponding locating pin to slide within the latch slot; the panel body of the first latch device having at least one slide channel formed adjacent a second end thereof for permitting the second latch device to slide therein the latch board of the panel body of the first latch device being formed with a latch hole for hooking a latch hook of the first lateral end of the insertion seat of the central processor.

3. The linkage-type fixing device as claimed in claim 1, wherein the first latch device further includes at least one stopper slide cavity formed at the second end of the panel body of the first latch device, the second latch device having a stopper slide pin passing into the stopper slide cavity to slide therein for restricting a sliding distance of the second latch device.

4. The linkage-type fixing device as claimed in claim 1, wherein the first latch device further includes at least one restricting bar projecting downwardly from the second end of the panel body of the first latch device, whereby when the panel body of the first latch device is bridged over the central processor, the restricting bar is disposed against an outer edge of a stopper section of a second lateral end of the insertion seat for limiting rotation of the first latch device in a rotational direction latching the first latch device with the heat-radiator.

5. The linkage-type fixing device as claimed in claim 2, wherein the slide channel of the panel body of the first latch device is formed by punching at least one L-shaped projecting plate from the panel body of the first latch device, the at least one L-shaped projecting plate together with the panel body of the first latch device defining the slide channel therebetween.

6. The linkage-type fixing device as claimed in claim 2, wherein two opposite sides of the second end of the panel body of the first latch device have at least two L-shaped projecting plates respectively formed thereon, the at least two L-shaped projecting plates together with the panel body of the first latch device defining the slide channel therebetween.

7. The linkage-type fixing device as claimed in claim 1, wherein each latch slot has a first end formed with an enlarged hole and two lateral edges of the latch slot are gradually downwardly inclined toward a second end of the latch slot.

8. The linkage-type fixing device as claimed in claim 1, wherein the first end of the linkage slot is formed with an enlarged hole for permitting the enlarged head section of a respective locating pin to pass therethrough and extend into a bottom end of a corresponding latch slot.

9. The linkage-type fixing device as claimed in claim 1, wherein the second latch device further includes at least one stopper slide pin downward projecting from an edge of the panel body of the second latch device for correspondingly sliding within a stopper slide cavity formed in the first latch device.

10. The linkage-type fixing device as claimed in claim 1, wherein the linkage slot of the second latch device is formed with a projecting section on an edge of the linkage slot near the second end thereof, whereby when the pin body of a corresponding locating pin is slidably positioned at the second end of the linkage slot, the projecting section stops an outer edge of the pin body of the corresponding locating pin.

\* \* \* \* \*